(12) United States Patent
Sun et al.

(10) Patent No.: US 12,261,193 B2
(45) Date of Patent: Mar. 25, 2025

(54) DISPLAY PANEL AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Kuo Sun, Beijing (CN); Guoqiang Tang, Beijing (CN); Weiyun Huang, Beijing (CN); Ling Shi, Beijing (CN); Xuan Pang, Beijing (CN); Qifu Ran, Beijing (CN); Qiyang Wu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 724 days.

(21) Appl. No.: 17/614,699

(22) PCT Filed: Dec. 25, 2020

(86) PCT No.: PCT/CN2020/139687
§ 371 (c)(1),
(2) Date: Nov. 29, 2021

(87) PCT Pub. No.: WO2022/134097
PCT Pub. Date: Jun. 30, 2022

(65) Prior Publication Data
US 2023/0025386 A1    Jan. 26, 2023

(51) Int. Cl.
*H01L 27/15*       (2006.01)
*H01L 33/62*       (2010.01)

(52) U.S. Cl.
CPC ............ *H01L 27/156* (2013.01); *H01L 33/62* (2013.01)

(58) Field of Classification Search
CPC ............. G09G 3/32; G09G 2300/0426; G09G 2300/0452; G09G 2300/0408; H01L 33/62; H01L 27/156; H10K 59/00
See application file for complete search history.

(56) References Cited

U.S. PATENT DOCUMENTS 10,460,656 B2* 10/2019 Xi ................... G09G 3/3225
11,227,538 B2*  1/2022 Yang ................ H10K 59/121
(Continued)

FOREIGN PATENT DOCUMENTS

CN    110265455 A    9/2019
CN    110767139 A    2/2020
(Continued)

OTHER PUBLICATIONS

Written Opinion for PCT Patent Application No. PCT/CN2020/139687 mailed Sep. 27, 2021.
(Continued)

*Primary Examiner* — Vinh T Lam
(74) *Attorney, Agent, or Firm* — Perilla Knox & Hildebrandt LLP; Kenneth A. Knox

(57) ABSTRACT

A display panel and a display device are described. The display panel includes a first display area, the first display area includes a first external area and a first compression area, and the first compression area is located at a side in a first direction of the first external area, wherein the first direction is parallel to the data line. The display panel further includes a plurality of first light-emitting units and a plurality of first pixel driving circuits.

20 Claims, 12 Drawing Sheets

(56) References Cited

U.S. PATENT DOCUMENTS

| | | | | |
|---|---|---|---|---|
| 11,348,523 B2* | 5/2022 | Chen | ................... | G09G 3/3233 |
| 11,404,512 B2* | 8/2022 | Kim | ..................... | H10K 59/17 |
| 11,489,007 B2* | 11/2022 | Yang | .................... | H01L 27/156 |
| 11,810,504 B2* | 11/2023 | Cheng | ................... | H10K 59/88 |
| 11,862,081 B2* | 1/2024 | Cheng | ................ | G09G 3/3233 |
| 12,058,905 B2* | 8/2024 | Li | ....................... | H10K 59/131 |
| 12,069,909 B2* | 8/2024 | Huang | ................ | H10K 59/121 |
| 12,131,695 B2* | 10/2024 | Cheng | ................... | H10K 59/65 |
| 12,136,389 B2* | 11/2024 | Du | ...................... | H10K 59/131 |
| 2020/0411610 A1 | 12/2020 | Zhang | | |
| 2022/0310743 A1* | 9/2022 | Yi | ...................... | H10K 59/123 |
| 2023/0099190 A1* | 3/2023 | Zhong | ................ | H01L 25/0753 |
| | | | | 349/33 |

FOREIGN PATENT DOCUMENTS

| | | | |
|---|---|---|---|
| CN | 110767697 | A | 2/2020 |
| CN | 111091772 | A | 5/2020 |
| CN | 111446282 | A | 7/2020 |
| CN | 111708199 | A | 9/2020 |
| CN | 110767139 | B | 12/2020 |
| TW | 202001842 | A | 1/2020 |
| TW | I684047 | B | 2/2020 |
| WO | 2020133950 | A1 | 7/2020 |
| WO | 2020180379 | A1 | 9/2020 |
| WO | 2020199541 | A1 | 10/2020 |

OTHER PUBLICATIONS

First Office Action for CN Patent Application No. 2020800036971 of Jan. 27, 2025.

\* cited by examiner

DISPLAY PANEL AND DISPLAY DEVICE

CROSS-REFERENCE TO RELATED APPLICATION

The present application is a 35 U.S.C. § 371 national phase application of International Application No. PCT/CN2020/139687 filed on Dec. 25, 2020, the entire disclosure of which is incorporated herein as a part of the present application for all purposes.

TECHNICAL FIELD

The present disclosure relates to the field of display technology and, in particular to a display panel and a display device.

BACKGROUND

Under-screen camera technology is to set a light-transmissive area on the display panel, and set the camera and the light-transmissive area directly facing each other to achieve full-screen display. However, it is difficult to achieve a normal display while achieving a larger light transmittance in the light-transmissive area.

It should be noted that the information disclosed in the background section above is only used to enhance the understanding of the background of the present disclosure, and therefore may include information that does not constitute the prior art known to those of ordinary skill in the art.

SUMMARY

According to an aspect of the present disclosure, a display panel is provided. The display panel includes a first display area, the first display area includes a first external area and a first compression area, and the first compression area is located at a side in the first direction of the first external area, wherein the first direction is parallel to a data line in the display panel. The display panel further includes: a plurality of first light-emitting units, and a plurality of first pixel driving circuits. The number of the first light-emitting units is the same as the number of the first pixel driving circuits. A plurality of the first light-emitting units is arranged in an array along a row direction and a column direction in the first display area, wherein the column direction is parallel to the first direction. A plurality of the first pixel driving circuits is arranged in an array along the row and column directions in the first compression area, and at least part of the first pixel driving circuits is configured to provide drive current to the first light-emitting units located in the first external area. The number of rows in the first pixel driving circuits is equal to the number of rows in the first light-emitting units. The number of columns in the first pixel driving circuits is equal to the number of columns in the first light-emitting units.

In an exemplary embodiment of the present disclosure, the first display area includes a plurality of first column-direction extension areas arranged along the row direction, each of the first column-direction extension areas extends in the column direction, and the number of columns in the first column-direction extension areas is the same as the number of columns in the first light-emitting units. Each of the first column-direction extension areas is respectively provided with a column of the first light-emitting units and a column of the first pixel driving circuits.

In an exemplary embodiment of the present disclosure, the plurality of first light-emitting units includes: first sub-light-emitting units in an array of N1 rows and M columns, and second sub-light-emitting units in an array of N2 rows and M columns. The first sub-light-emitting units are located in the first external area. The first sub-light-emitting units in the (X+1)-th row are located at a side in the first direction of the first sub-light-emitting units in the X-th row, where X is a positive integer greater than or equal to 1 and less than or equal to N1−1. The second sub-light-emitting units are located in the first compression area, wherein the second sub-light-emitting units in the (X+1)-th row are located at a side in the first direction of the second sub-light-emitting units in the X-th row, where X is a positive integer greater than or equal to 1 and less than or equal to N2−1. The first pixel driving circuits includes: first sub-pixel driving circuits in an array of N1 rows and M columns, and second sub-pixel driving circuits in an array of N2 rows and M columns. At least part of the first sub-pixel driving circuits is configured to provide driving current to the first sub-light-emitting units, wherein the first sub-pixel driving circuits in the (X+1)-th row are located at a side in the first direction of the first sub-pixel driving circuits in the X-th row, where X is a positive integer greater than or equal to 1 and less than or equal to N1−1. The second sub-pixel driving circuits are configured used to provide driving current to the second sub-light-emitting units, wherein the second sub-pixel driving circuits in the (X+1)-th row are located at a side in the first direction of the second sub-pixel driving circuits in the X-th row, where X is a positive integer greater than or equal to 1 and less than or equal to N2−1. Besides, N1 is a positive integer greater than or equal to 1, and M is a positive integer greater than or equal to 1.

In an exemplary embodiment of the present disclosure, the first sub-pixel driving circuits in X-th row are configured to provide driving current to the first sub-light-emitting units in the X-th row located in the same first column-direction extension area, where X is a positive integer greater than or equal to 1 and less than or equal to N1. The second sub-pixel driving circuits in the X-th row are configured to provide driving current to the second sub-light-emitting units in the X-th row located in the same first column-direction extension area, where X is a positive integer greater than or equal to 1 and less than or equal to N2.

In an exemplary embodiment of the present disclosure, the first external area includes a first light-transmissive area and a first sub-display area, and the first light-transmissive area and the first sub-display area are arranged along the row direction. The display panel further includes a plurality of second pixel driving circuits, the plurality of second pixel driving circuits are located in the first sub-display area, and the plurality of second pixel driving circuits include the second pixel driving circuits arranged along the row and column directions in an array of N1 rows and M1 columns. The second pixel driving circuits in the (X+1)-th row are located at a side in the first direction of the second pixel driving circuits in the X-th row, where X is a positive integer greater than or equal to 1 and less than or equal to N1−1, and M1 is equal to the number of columns of first sub-light-emitting units in the first sub-display area. Each of the first column-direction extension areas located in the first sub-display area is respectively provided with a column of the second pixel driving circuits. In the same first column-direction extension area, the second pixel driving circuits in the X-th row are configured to provide driving current to the first sub-light-emitting units in the X-th row in the first sub-display area, where X is a positive integer greater than or equal to 1 and less than or equal to N1. In the same first column-direction extension area, the first sub-pixel driving circuits in the X-th row are configured to provide driving current to the first sub-light-emitting units in the X-th row located in the light-transmissive area, where X is a positive integer greater than or equal to 1 and less than or equal to N1.

In an exemplary embodiment of the present disclosure, the first sub-display area is located at one side or both sides in the row direction of the light-transmissive area.

In an exemplary embodiment of the present disclosure, the second pixel driving circuits in the X-th row and the first sub-pixel driving circuits in the X-th row share the same gate driving signal.

In an exemplary embodiment of the present disclosure, the second sub-pixel driving circuits in each row is located at a side in the first direction of the first sub-pixel driving circuits in each row.

In an exemplary embodiment of the present disclosure, the plurality of first sub-pixel driving circuits include two adjacent rows of the first sub-pixel driving circuits, and at least one row of the second sub-pixel driving circuits is arranged between the two adjacent rows of the first sub-pixel driving circuits.

In an exemplary embodiment of the present disclosure, the same number of rows of the second sub-pixel driving circuits is arranged between every two adjacent rows of the first sub-pixel driving circuits.

In an exemplary embodiment of the present disclosure, the display panel further includes a normal display area, and the normal display area is located at a side of the first compression area away from the first external area. The display panel further includes a third pixel driving circuit located in the normal display area, wherein the size in the column direction of the third pixel driving circuit is larger than the size in the column direction of each of the first pixel driving circuits.

In an exemplary embodiment of the present disclosure, the pixel density of the normal display area is equal to the pixel density of the first display area.

In an exemplary embodiment of the present disclosure, the ratio of the size in the column direction of the first external area to the size in the column direction of the first compression area is from 1:12 to 1:8.

In an exemplary embodiment of the present disclosure, the display panel further includes a second display area, and the second display area includes a second external area and a second compression area. The second external area is located at a side of the first external area away from the first compression area, and the second compression area is located at a side of the second external area away from the first external area. The display panel further includes: a plurality of fourth light-emitting units and a plurality of fourth pixel driving circuits, wherein the number of the fourth light-emitting units and the number of the fourth pixel driving circuits are the same. A plurality of the fourth light-emitting units is arranged in an array along the row and column directions in the second display area. A plurality of the fourth pixel driving circuits is arranged in an array along the row and column directions in the second compression area. At least part of the fourth pixel driving circuits is configured to provide driving current to the fourth light-emitting units located in the second external area. The number of rows in the fourth pixel driving circuits is equal to the number of rows in the fourth light-emitting units, and the number of columns in the fourth pixel driving circuits is equal to the number of columns in the fourth light-emitting units.

In an exemplary embodiment of the present disclosure, the second display area includes a plurality of second column-direction extension areas arranged along the row direction, and each of the second column-direction extension areas extends along the column direction. The numbers of rows in the second column-direction extension areas, the fourth light-emitting units, and the first light-emitting units are the same. The second column-direction extension areas are directly opposite to the first column-direction extension areas in the column direction. Each of the second column-direction extension areas is respectively provided with a column of the fourth light-emitting units and a column of the fourth pixel driving circuits.

In an exemplary embodiment of the present disclosure, the plurality of fourth light-emitting units include: third sub-light-emitting units in an array of N3 rows and M columns, and fourth sub-light-emitting units in an array of N4 rows and M columns. The third sub-light-emitting units are located in the second external area. The third sub-light-emitting units in the (X+1)-th row are located at a side in the second direction of the third sub-light-emitting units in the X-th row, where the second direction is opposite to the first direction, and X is a positive integer greater than or equal to 1 and less than or equal to N3−1. The fourth sub-light-emitting units are located in the second compression area. The fourth sub-light-emitting units in the (X+1)-th row are located at a side in the second direction of the fourth sub-light-emitting units in the X-th row, where X is a positive integer greater than or equal to 1 and less than or equal to N4−1. The fourth pixel driving circuits include third sub-pixel driving circuits in an array of N3 rows and M columns, and fourth sub-pixel driving circuits in an array of N4 rows and M columns. At least part of the third sub-pixel driving circuits is configured to provide driving current to the third sub-light-emitting units. The third sub-pixel driving circuits in the (X+1)-th row are located at a side in the second direction of the third sub-pixel driving circuits in the X-th row, where X is a positive integer greater than or equal to 1 and less than or equal to N3−1. The fourth sub-pixel driving circuits are configured to provide driving current to the fourth sub-light-emitting units. The fourth sub-pixel driving circuits in the (X+1)-th row are located at a side in the second direction of the fourth sub-pixel driving circuits in the X-th row, where X is a positive integer greater than or equal to 1 and less than or equal to N4−1. Besides, N3 is a positive integer greater than or equal to 1.

In an exemplary embodiment of the present disclosure, the third sub-pixel driving circuits in the X-th row are configured to provide driving current to the third sub-light-emitting units in the X-th row located in the same second column-direction extension area, where X is a positive integer greater than or equal to 1 and less than or equal to N3. The fourth sub-pixel driving circuits in the X-th row is configured to provide driving current to the fourth sub-light-emitting units in the X-th row located in the same second column-direction extension area, where X is a positive integer greater than or equal to 1 and less than or equal to N4.

In an exemplary embodiment of the present disclosure, the second external area includes a second light-transmissive area and a second sub-display area, and the second light-transmissive area and the second sub-display area are arranged along the row direction. The display panel further includes a plurality of fifth pixel driving circuits, and the fifth pixel driving circuits are located in the second sub-display area. The plurality of fifth pixel driving circuits includes the fifth pixel driving circuits arranged along the row and column directions in an array of N3 rows and M2 columns. The fifth pixel driving circuits in the (X+1)-th row are located at a side in the second direction of the fifth pixel driving circuits in the X-th row, where X is a positive integer greater than or equal to 1 and less than or equal to N3−1, and M2 is equal to the number of columns of the third sub-light-emitting units in the second sub-display area. Each column of the second column-direction extension areas located in the second sub-display area is respectively provided with a row of the fifth pixel driving circuits.

In the same second column-direction extension area, the fifth pixel driving circuits in the X-th row are configured to provide driving current to the third sub-light-emitting units in the X-th row located in the second sub-display area, where X is a positive integer greater than or equal to 1 and less than or equal to N3. In the same second column-direction extension area, the third sub-pixel driving circuits in the X-th row are configured to provide driving current to the third sub-light-emitting units in the X-th row located in the second light-transmissive area, where X is a positive integer greater than or equal to 1 and less than or equal to N3.

In an exemplary embodiment of the present disclosure, the second sub-display area is located at one side or both sides in the row direction of the light-transmissive area.

In an exemplary embodiment of the present disclosure, the second light-transmissive area and the first light-transmissive area are arranged opposite to each other in the column direction.

In an exemplary embodiment of the present disclosure, the fifth pixel driving circuits in the X-th row and the third sub-pixel driving circuits in the X-th row share the same gate driving signal, where X is a positive integer greater than or equal to 1 and less than or equal to N3.

In an exemplary embodiment of the present disclosure, the fourth sub-pixel driving circuits in each row are located at a side in the second direction of the third sub-pixel driving circuits in each row.

In an exemplary embodiment of the present disclosure, the plurality of third sub-pixel driving circuits include two adjacent rows of the third sub-pixel driving circuits, and at least one row of the fourth sub-pixel driving circuits is arranged between the two adjacent rows of the third sub-pixel driving circuits.

In an exemplary embodiment of the present disclosure, the same number of rows of the fourth sub-pixel driving circuits is arranged between every two adjacent rows of the third sub-pixel driving circuits.

According to an aspect of the present disclosure, there is provided a display device. The display device comprises: the above-mentioned display panel and a camera, wherein at least part of the camera is arranged directly opposite to the first external area of the display panel.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the present disclosure, and are used together with the specification to explain the principle of the present disclosure. Understandably, the drawings in the following description are only some embodiments of the present disclosure. For those of ordinary skill in the art, other drawings can be obtained based on these drawings without creative work.

DETAILED DESCRIPTION OF THE EMBODIMENTS

Figure 1:
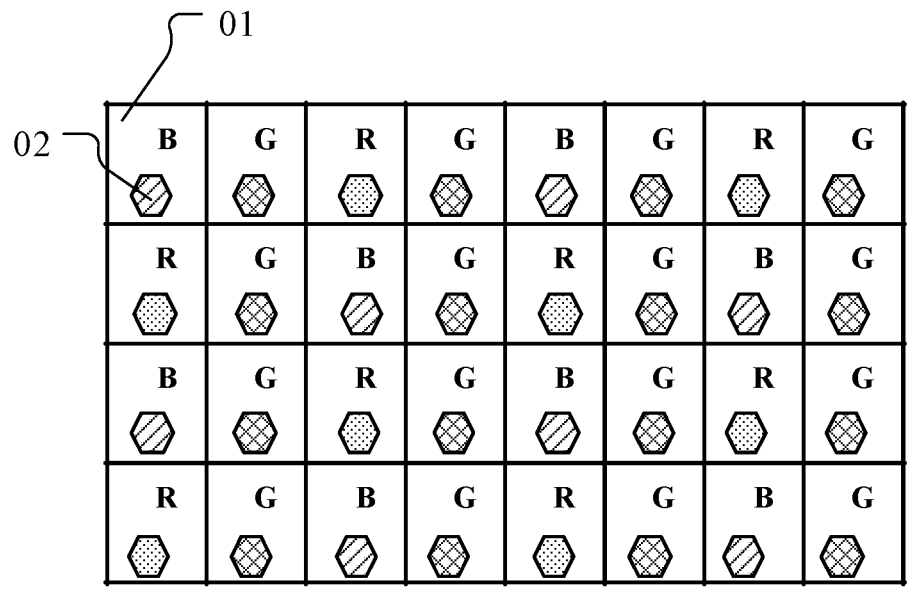
FIG. 1 is a schematic structural diagram of a conventional display panel in the related art.

Example embodiments will now be described more fully with reference to the accompanying drawings. However, the example embodiments can be implemented in various forms, and should not be construed as being limited to the examples set forth herein. On the contrary, the provision of these embodiments makes the present disclosure more comprehensive and complete, and fully conveys the concept of the example embodiments to those skilled in the art. The same reference numerals in the figures indicate the same or similar structures, and thus their detailed descriptions will be omitted.

Although relative terms such as "upper" and "lower" are used in the specification to describe the relative relationship between one component represented by an icon and another component, these terms are used in the specification only for convenience, for example, based on the direction of the example as shown in the drawings. It can be understood that if the device represented by an icon is turned over and turned upside down, the component described as "being upper" will become the "lower" component. Other relative terms, such as "high", "low", "top", "bottom", "left", and "right" have similar meanings. When a structure is "on" another structure, it may mean that the structure is integrally formed on the other structure, or that the structure is "directly" disposed on the other structure, or that the structure is "indirectly" disposed on the other structure through a third structure.

The terms "a", "an", and "the" are used to indicate the presence of one or more elements/components/etc. The terms "comprise" and "have" are used to indicate open inclusion, and indicate that there may be additional elements/components/etc., in addition to the elements/components/etc. as listed.

As shown in FIG. 1, a schematic structural diagram of a conventional display panel in the related art is illustrated. The conventional display panel includes pixel driving circuits 01 and light-emitting units 02. The pixel driving circuits 01 and the light-emitting units 02 are arranged in a one-to-one correspondence, and the area where a pixel driving circuit is located at least partially overlaps with the area where a light-emitting unit, corresponding to the pixel driving circuit, is located.

Figure 2:
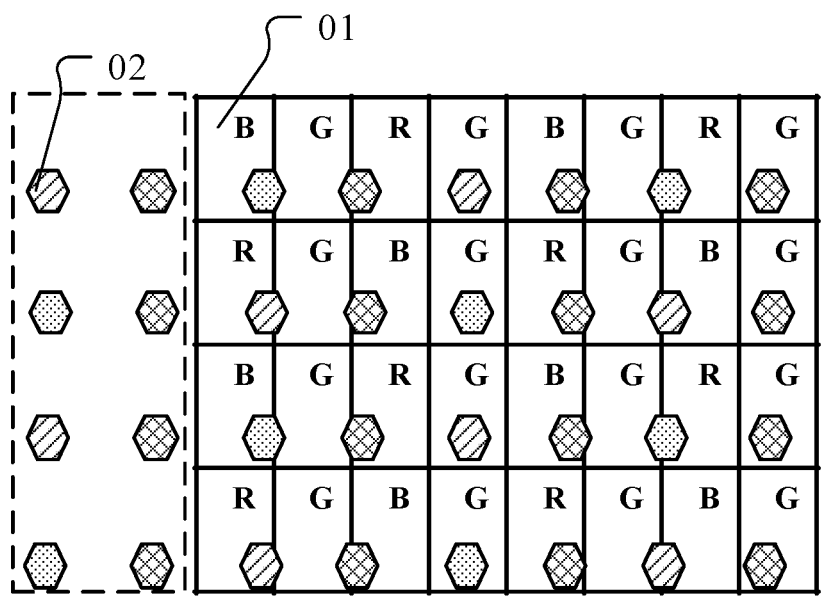
FIG. 2 is a schematic structural diagram of another display panel in the related art.

As shown in FIG. 2, a schematic structural diagram of another display panel in the related art is illustrated. The display panel also includes pixel driving circuits 01 and light-emitting units 02. The display panel has compressed sizes of a plurality of pixel driving circuits 01 in the row direction, so that an external area 03 in which only the light-emitting units 02 are provided can be formed on the display panel. Since there is no pixel driving circuit in the external area 03, the external area 03 has a higher transmittance, and the position where the external area 03 is located can be accordingly provided with a camera. When the display panel needs to be provided with a plurality of cameras arranged in the row direction, the external area 03 needs to have a larger size in the row direction. Thus, it is necessary to compress more pixel driving circuits or increase the compression ratio of the pixel driving circuits. However, the above settings will increase the structural complexity of the display panel and the difficulty of the manufacturing process. At the same time, since the size of the pixel driving circuits in the row direction is originally small, forming an external area by compressing the pixel driving circuits along the row direction is not conducive to the layout design of the pixel driving circuits.

Figure 3:
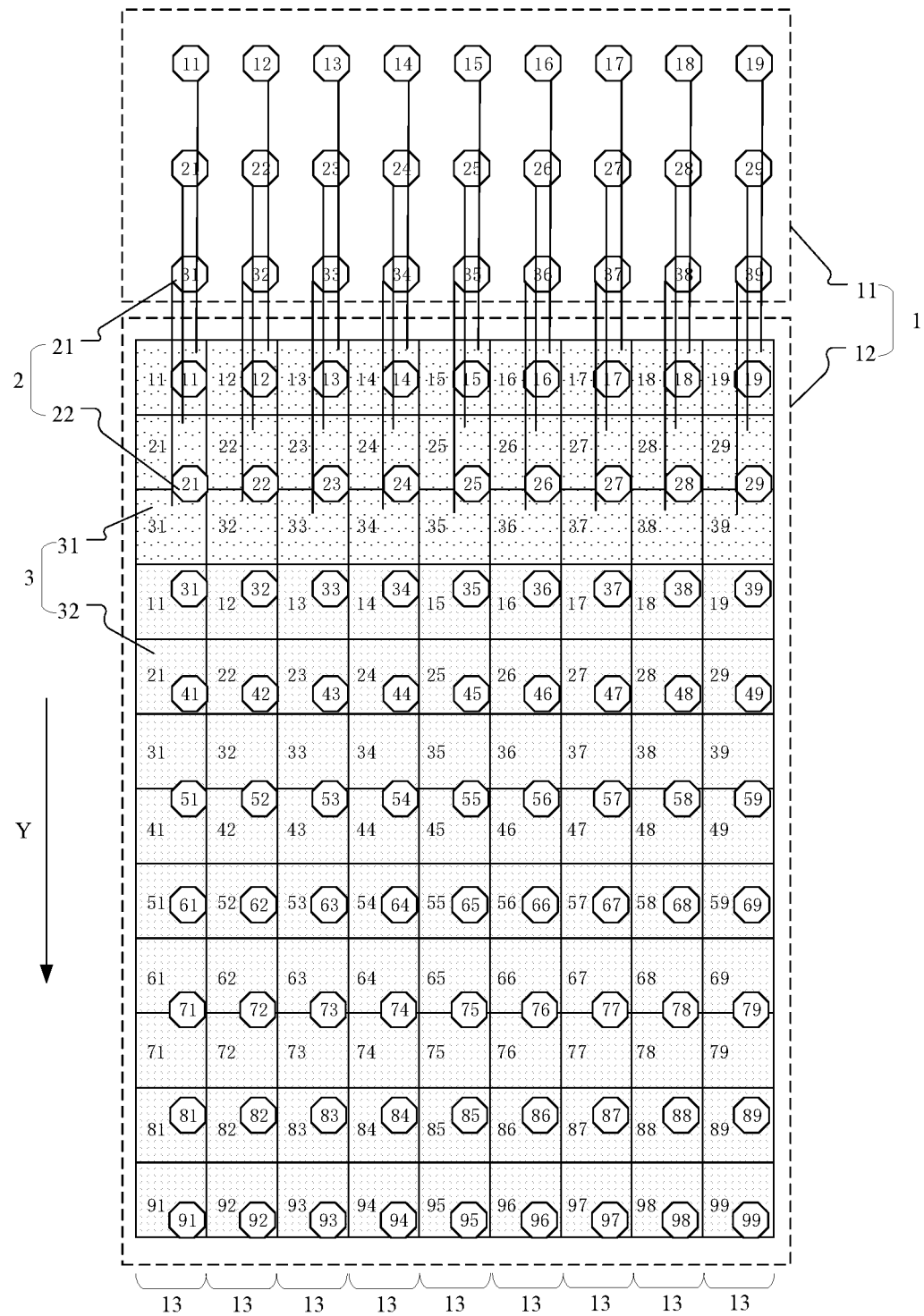
FIG. 3 is a schematic structural diagram of a display panel according to an exemplary embodiment of the present disclosure.

In view of the foregoing, an exemplary embodiment provides a display panel, as shown in FIG. 3, which is a schematic structural diagram of a display panel according to an exemplary embodiment of the present disclosure. The display panel may include a first display area 1, the first display area 1 may include a first external area 11 and a first compression area 12, and the first compression area 12 may be located at a side in the first direction Y of the first external area 11. The first direction Y is parallel to the data line in the display panel. The display panel may further include a plurality of first light-emitting units 2 and a plurality of first pixel driving circuit 3. The number of the first light-emitting units and the number of the first pixel driving circuits may be the same. A plurality of the first light-emitting units 2 may be arranged in an array along a row direction and a column direction in the first display area 1, wherein the column direction is parallel to the first direction Y. A plurality of the first pixel driving circuits 3 may be arranged in an array along the row and column directions in the first compression area 12. Part of the first pixel driving circuits 3 can be configured to provide driving current to the first light-emitting units located in the first external area 11. The number of rows in the first pixel driving circuits 3 may be equal to the number of rows in the first light-emitting units 2. The number of columns in the first pixel driving circuit 3 may be equal to the number of columns in the first light-emitting units 2. Additionally, the data line is a signal line that provides data signal to the pixel driving circuits.

In an exemplary embodiment, the first pixel driving circuits 3 and the first light-emitting units 2 have the same number of rows and the same number of columns, and the size in the column direction of the integrated area of the first light-emitting units 2 (the first display area 1) is larger than the size in the column direction of the integrated area of the first pixel driving circuits (first compressed area). That is, it is equivalent to compressing the first pixel driving circuits 3 in the first display area 1 into the first compression area 12 in the column direction, so as to reserve the first external area 11. On one hand, this arrangement enables that only the light-emitting units are provided in the first external area 11, and no pixel driving circuit is provided, so that the first external area 11 has a higher light transmittance and the position where the first external area 11 is located can be provided with a camera. On the other hand, the first external area 11 has a relatively large size in the row direction, which can facilitate the installation of a camera in the row direction. Also, the size of the pixel driving circuits in the column direction is relatively large, and compressing the pixel driving circuits in the column direction has less influence on the layout design of the pixel driving circuits.

In an exemplary embodiment, as shown in FIG. 3, in the first display area, the number of the first light-emitting units in each row of the first light-emitting units may be equal to that of the first pixel driving circuits in each row of the first pixel driving circuits. The number of the first light-emitting units in each column of the first light-emitting units may be equal to the number of the first pixel driving circuits in each column of first pixel driving circuits. The density of the first light-emitting units in the first compression area may be equal to the density of the first light-emitting units in the first external area.

In an exemplary embodiment, as shown in FIG. 3, the first display area may include a plurality of first column-direction extension areas 13 arranged along the row direction, and each of the first column-direction extension areas 13 may extend along the column direction. The number of columns in the first column-direction extension areas 13 may be the same as the number of columns in the first light-emitting units 2. Each of the first column-direction extension areas 13 may be provided respectively with a column of the first light-emitting units 2 and a column of the first pixel driving circuits 3. That is, in the first display area 1, the pixel driving circuits are not compressed in the row direction, and columns of the first pixel driving circuits and columns of the first light-emitting units are arranged in one-to-one correspondence. As shown in FIG. 3, the first light-emitting units 2 can be evenly distributed in the first display area 1, the first pixel driving circuits 3 can be evenly distributed in the first compression area 12, and the size of each first pixel driving circuit 3 can be the same.

In an exemplary embodiment, as shown in FIG. 3, the plurality of first light-emitting units 2 may include first sub-light-emitting units 21 in an array of 3 rows and 9 columns, and second sub-light-emitting units 22 in an array of 9 rows and 9 columns. The first sub-light-emitting units 21 may be located in the first external area 11. The first sub-light-emitting units 21 in the (X+1)-th row are located at a side in the first direction Y of the first sub-light-emitting units 21 in the X-th row, where X is a positive integer greater than or equal to 1 and less than or equal to 2. For example, the first sub-light-emitting units 21 in the second row are located at a side in the first direction Y of the first sub-light-emitting units 21 in the first row. The second sub-lightemitting units 22 may be located in the first compression area 12. The second sub-light-emitting units 22 in the (X+1)-th row are located at a side in the first direction Y of the second sub-light-emitting units 22 in the X-th row, where X is a positive integer greater than or equal to 1 and less than or equal to 8. For example, the second row of second sub-light-emitting units 22 is located at a side in the first direction Y of the first row of second sub-light-emitting units 22. As shown in FIG. 3, the numbers in the first sub-light-emitting units 21 and the second sub-light-emitting units 22 indicate the row and column coordinates of the respective light-emitting unit. For example, the first sub-light-emitting unit 21 marked with 31 represents the first sub-light-emitting unit 21 in the third row and the first column, and the second sub-light-emitting unit 22 marked with 31 represents the second sub-light-emitting unit 22 in the third row and the first column.

In an exemplary embodiment, as shown in FIG. 3, the first pixel driving circuits 3 may include: first sub-pixel driving circuits 31 in an array of 3 rows and 9 columns, and second sub-pixel driving circuits 32 in an array of 9 rows and 9 columns. The first sub-pixel driving circuits 31 are configured to provide driving current to the first sub-light-emitting units 21. The first sub-pixel driving circuits 31 in the (X+1)-th row are located at a side in the first direction Y of the first sub-pixel driving circuits 31 in the X-th row, where X is a positive integer greater than or equal to 1 and less than or equal to 2. For example, the first sub-pixel driving circuits 31 in the second row are located at a side in the first direction Y of the first sub-pixel driving circuits 31 in the first row. The second sub-pixel driving circuits 32 may be configured to provide driving current to the second sub-light-emitting units 22. The second sub-pixel driving circuits 32 in the (X+1)-th row are located at a side in the first direction Y of the second sub-pixel driving circuits 32 in the X-th row, where X is a positive integer greater than or equal to 1 and less than or equal to 8. For example, the second row of second sub-pixel driving circuits 32 is located at a side in the first direction Y of the first row of second sub-pixel driving circuits 32. As shown in FIG. 3, the numbers in the first sub-pixel driving circuits 31 and the second sub-pixel driving circuits 32 indicate the row and column coordinates of the respective pixel driving circuit. For example, the first sub-pixel driving circuit 31 marked with 31 indicates the first sub-pixel driving circuit 31 in the third row and the first column, and the second sub-pixel driving circuit 32 marked with 31 represent the second sub-pixel driving circuit 32 in the third row and first column.

In an exemplary embodiment, as shown in FIG. 3, the second sub-pixel driving circuits 32 in any row may be located at a side in the first direction Y of the first sub-pixel driving circuits 31 in any row. The first sub-pixel driving circuits 31 in the X-th row may be configured to provide driving current to the first sub-light-emitting units 21 in the X-th row located in the same first column-direction extension area 13, where X is a positive integer greater than or equal to 1 and less than or equal to 3. For example, the first sub-pixel driving circuit 31 in the first row and the first column is configured to provide driving current to the first sub-light-emitting unit 21 in the first row and the first column. The second sub-pixel driving circuits in the X-th row are configured to provide driving current to the second sub-light-emitting units in the X-th row located in the same first column-direction extension area 13 as the second sub-pixel driving circuits in the X-th row, where X is a positive integer greater than or equal to 1 and less than or equal to 9. For example, the second sub-pixel driving circuit 32 in the first row and the first column is configured to provide driving current to the second sub-light-emitting unit 22 in the first row and the first column.

It should be understood that in other exemplary embodiments, the first sub-light-emitting units, the second sub-light-emitting units, the first sub-pixel driving circuits, and the second sub-pixel driving circuits in the first display area 1 may also have other numbers of rows and columns, which are all within the protection scope of the present disclosure.

In an exemplary embodiment, as shown in FIG. 3, part of the second sub-pixel driving circuits 32 in the first compression area 12 needs to span multiple rows of pixel driving circuits and be connected to the second sub-light-emitting units 22 located in the same first column-direction extension area. For example, the first row of second sub-pixel driving circuits 32 needs to span 3 rows of pixel driving circuits and be connected to the first row of second sub-light-emitting units 22 located in the same first column-direction extension area 13. Especially, when the number of rows in the first sub-light-emitting units 21 is large, for example, when the number of rows in the first sub-light-emitting units 21 is 10 rows, the second sub-pixel driving circuits 32 in the first row need to span 10 rows of pixel driving circuits and be connected to the second sub-light-emitting units 22 located in the same first column-direction extension area. This arrangement may cause a long connection line between part of the second pixel driving circuits and the second light-emitting units.

Figure 4:
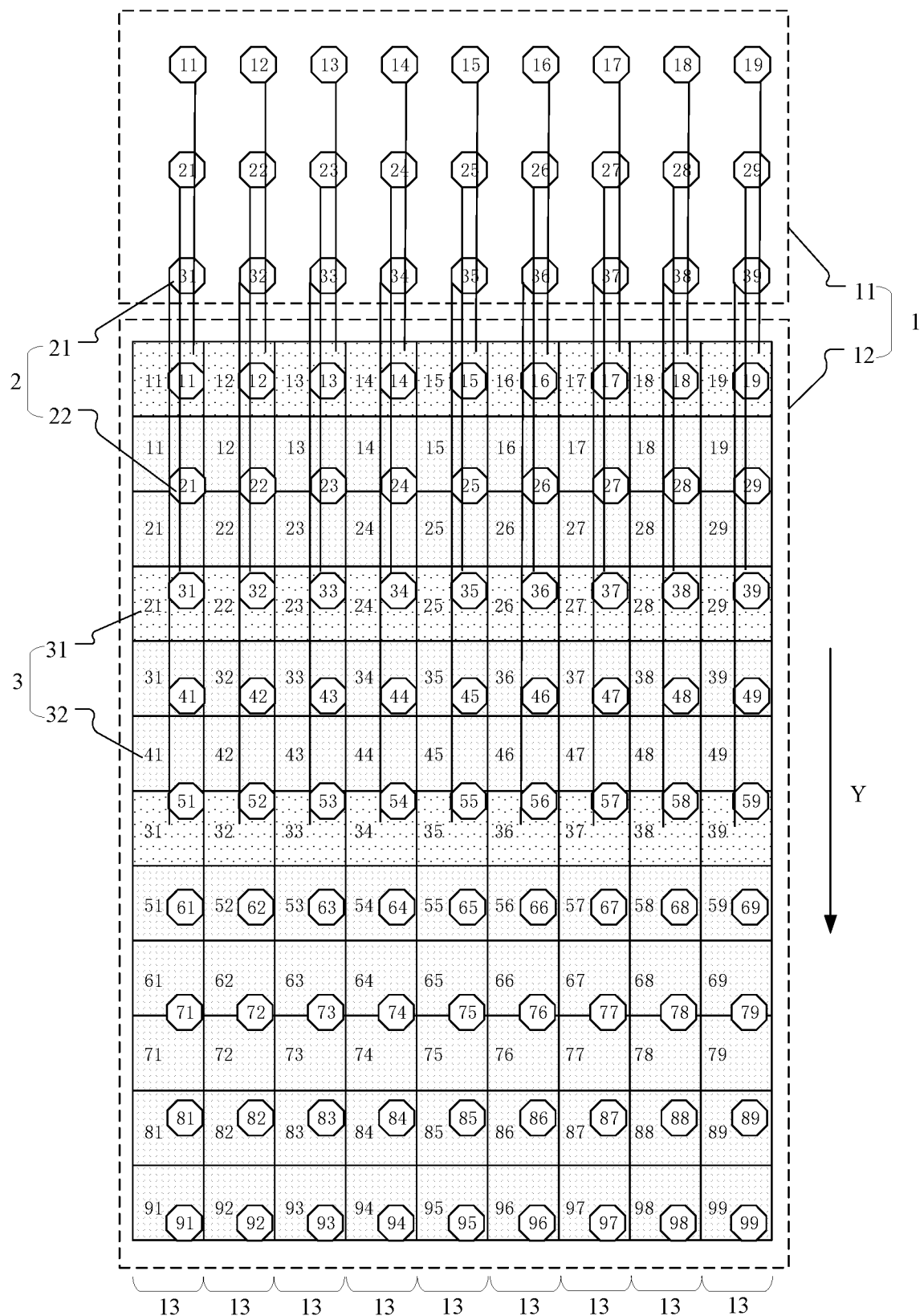
FIG. 4 is a schematic structural diagram of a display panel according to another exemplary embodiment of the present disclosure.

As shown in FIG. 4, a schematic structural diagram of a display panel according to another exemplary embodiment of the present disclosure is illustrated. In an exemplary embodiment, two rows of the second sub-pixel driving circuits 32 may be arranged between every two adjacent rows of the first sub-pixel driving circuits 31. The first sub-pixel driving circuits 31 in the first row may be located at a side in a direction opposite to the first direction Y of the second sub-pixel driving circuits 32 in the first row. That is, the first sub-pixel driving circuits 31 in the first row may be located in the first row among all the pixel driving circuits. As shown in FIG. 4, this arrangement can reduce the length of the connection line between part of the second pixel driving circuits and the second light-emitting units. For example, the second sub-light-emitting units 22 in the first row only need to span one row of pixel driving circuits and be connected to the second sub-pixel driving circuits 32 in the first row located in the same first column-direction extension area.

It should be understood that, in other exemplary embodiments, other rows of the second sub-pixel driving circuits may also be arranged between every two adjacent rows of the first sub-pixel driving circuits 31. For example, 4 rows of the second sub-pixel driving circuits can be arranged between every two adjacent rows of the first sub-pixel driving circuits 31. The number of rows in the second sub-pixel driving circuits between every two adjacent rows of the first sub-pixel driving circuits 31 may be the same or different. For example, two rows of the second sub-pixel driving circuits can be arranged between the first sub-pixel driving circuits 31 in the first row and the first sub-pixel driving circuits 31 in the second row, and five rows of the second sub-pixel driving circuits may be arranged between the first sub-pixel driving circuits 31 in the second row and the first sub-pixel driving circuits 31 in the third row. In addition, the first sub-pixel driving circuits 31 in the first row may also be arranged at other positions. For example, the first sub-pixel driving circuits 31 in the first row may be arranged at a side in the first direction Y of the second sub-pixel driving circuits 32 in the first row.

Figure 5:
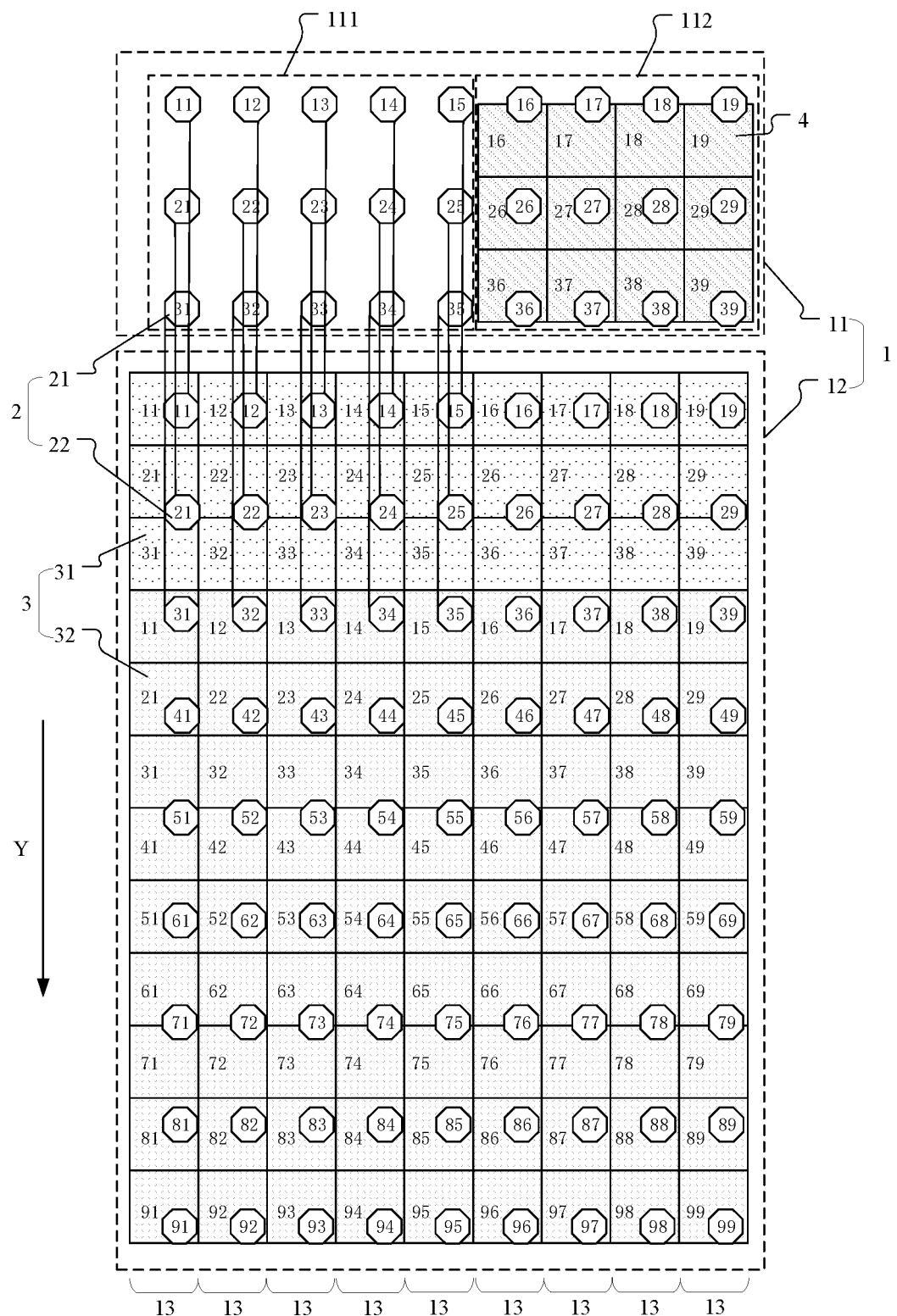
FIG. 5 is a schematic structural diagram of a display panel according to another exemplary embodiment of the present disclosure.

In an exemplary embodiment, as shown in FIG. 5, a schematic structural diagram of a display panel according to another exemplary embodiment of the present disclosure is illustrated. The first external area 11 may include a first light-transmissive area 111 and a first sub-display area 112. The first light-transmissive area 111 and the first sub-display area 112 may be arranged along the row direction. The display panel may also include a plurality of second pixel driving circuits 4. The plurality of second pixel driving circuits 4 may be located in the first sub-display area 112. The plurality of second pixel driving circuits 4 may include the second pixel driving circuits 4 arranged along the row and column directions in an array of 3 rows and 4 columns. Accordingly, the first sub-light-emitting units 21 in an array of 3 rows and 4 columns are arranged in the first sub-display area 112. The numbers annotated in the second pixel driving circuits 4 represent the row and column coordinates of the respective second pixel driving circuit. For example, the second pixel driving circuit 4 marked with 28 represents the second pixel driving circuit in the second row and the eighth column. The second pixel driving circuits in the (X+1)-th row may be located at a side in the first direction of the second pixel driving circuits in the X-th row, where X is a positive integer greater than or equal to 1 and less than or equal to 2. Each of the first column-direction extension areas 13 located in the first sub-display area is provided with a column of the second pixel driving circuits 4. In the same first column-direction extension area 13, the second pixel driving circuits 4 in the X-th row are configured to provide driving current to the first sub-light-emitting units 21 in the X-th row located in the first sub-display area, where X is a positive integer greater than or equal to 1 and less than or equal to 3. For example, the second pixel driving circuit 4 in the second row and the eighth column may be configured to provide driving current to the first sub-light-emitting unit 21 in the second row and the eighth column. In the same first column-direction extension area, the first sub-pixel driving circuits in the X-th row are configured to provide driving current to the first sub-light-emitting units in the X-th row located in the light-transmissive area, where X is a positive integer greater than or equal to 1 and less than or equal to 3. For example, the first sub-pixel driving circuit in the second row and the third column may be configured to provide a driving current to the first sub-light-emitting unit 21 in the second row and the third column.

Figure 6:
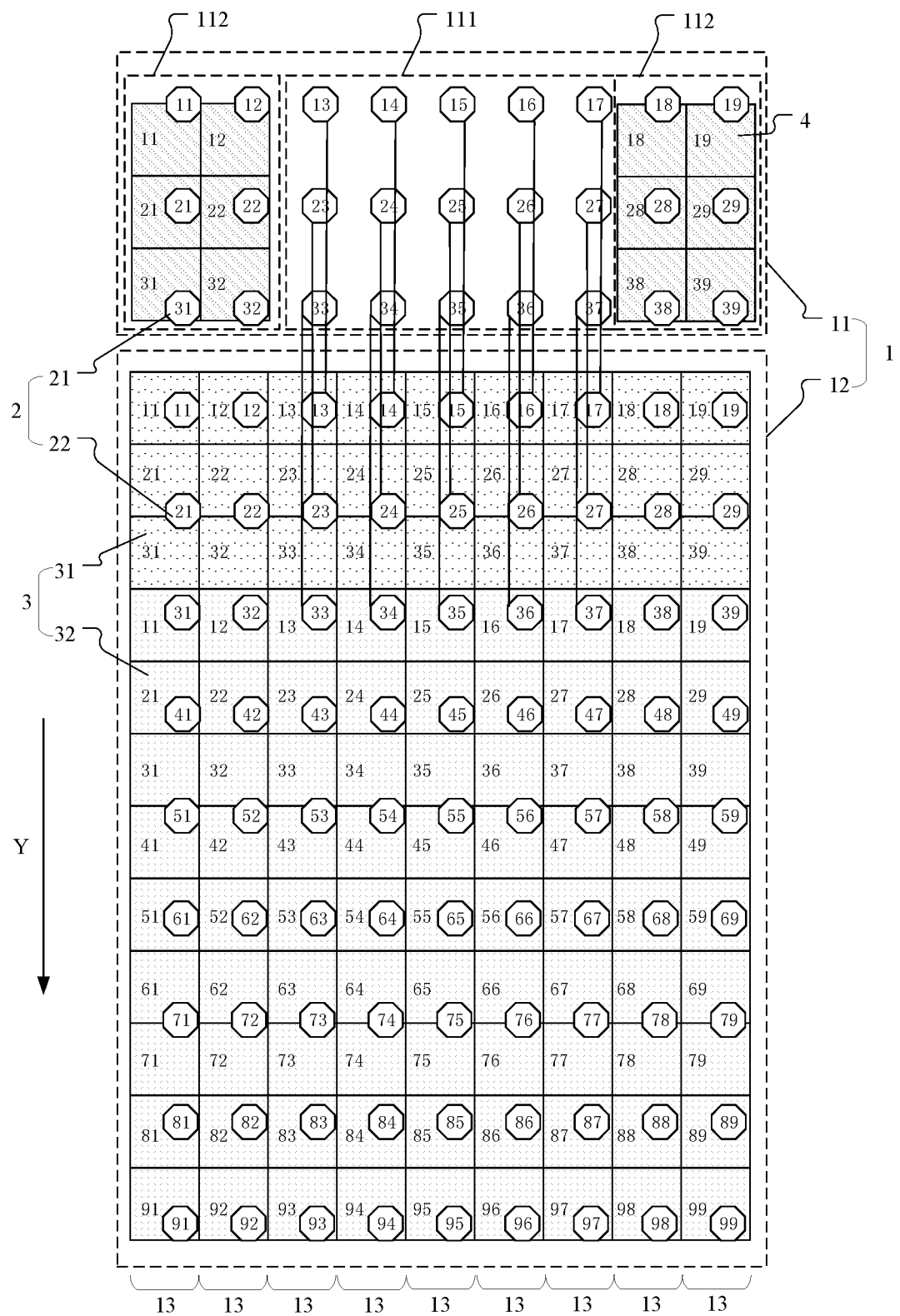
FIG. 6 is a schematic structural diagram of a display panel according to another exemplary embodiment of the present disclosure.

In an exemplary embodiment, as shown in FIG. 5, the first sub-display area 112 may be located at a side in the row direction of the light-transmissive area 111. It should be understood that, in other exemplary embodiments, the first sub-display area 112 may be located at both sides in the row direction of the light-transmissive area 111. As shown in FIG. 6, a schematic structural diagram of a display panel according to another exemplary embodiment of the present disclosure is illustrated. The first sub-display area 112 may be located at both sides in the row direction of the light-transmissive area 111. In addition, in other exemplary embodiments, the second pixel driving circuits 4 in an array of other rows and columns may also be integrated in the first sub-display area.

Figure 7:
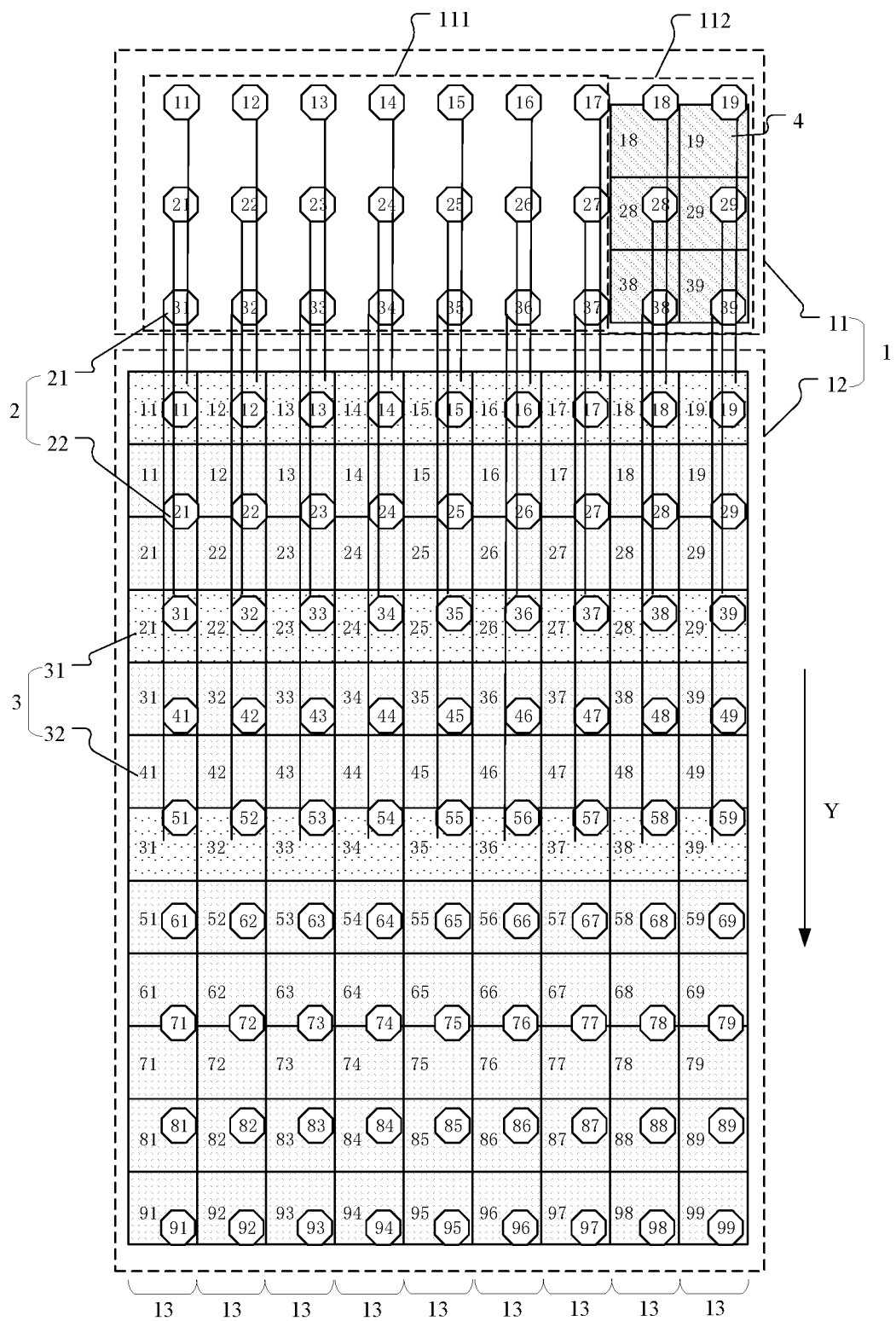
FIG. 7 is a schematic structural diagram of a display panel according to another exemplary embodiment of the present disclosure.

As shown in FIG. 7, a schematic structural diagram of a display panel according to another exemplary embodiment of the present disclosure is illustrated. The display panel has the characteristics of the display panel shown in FIGS. 4 and 5 at the same time. That is, the first external area 11 may include a first light-transmissive area 111 and a first sub-display area 112 arranged along the row direction. A plurality of rows of the second sub-pixel driving circuits 32 may be arranged between every two adjacent rows of the first sub-pixel driving circuits 31.

Figure 8:
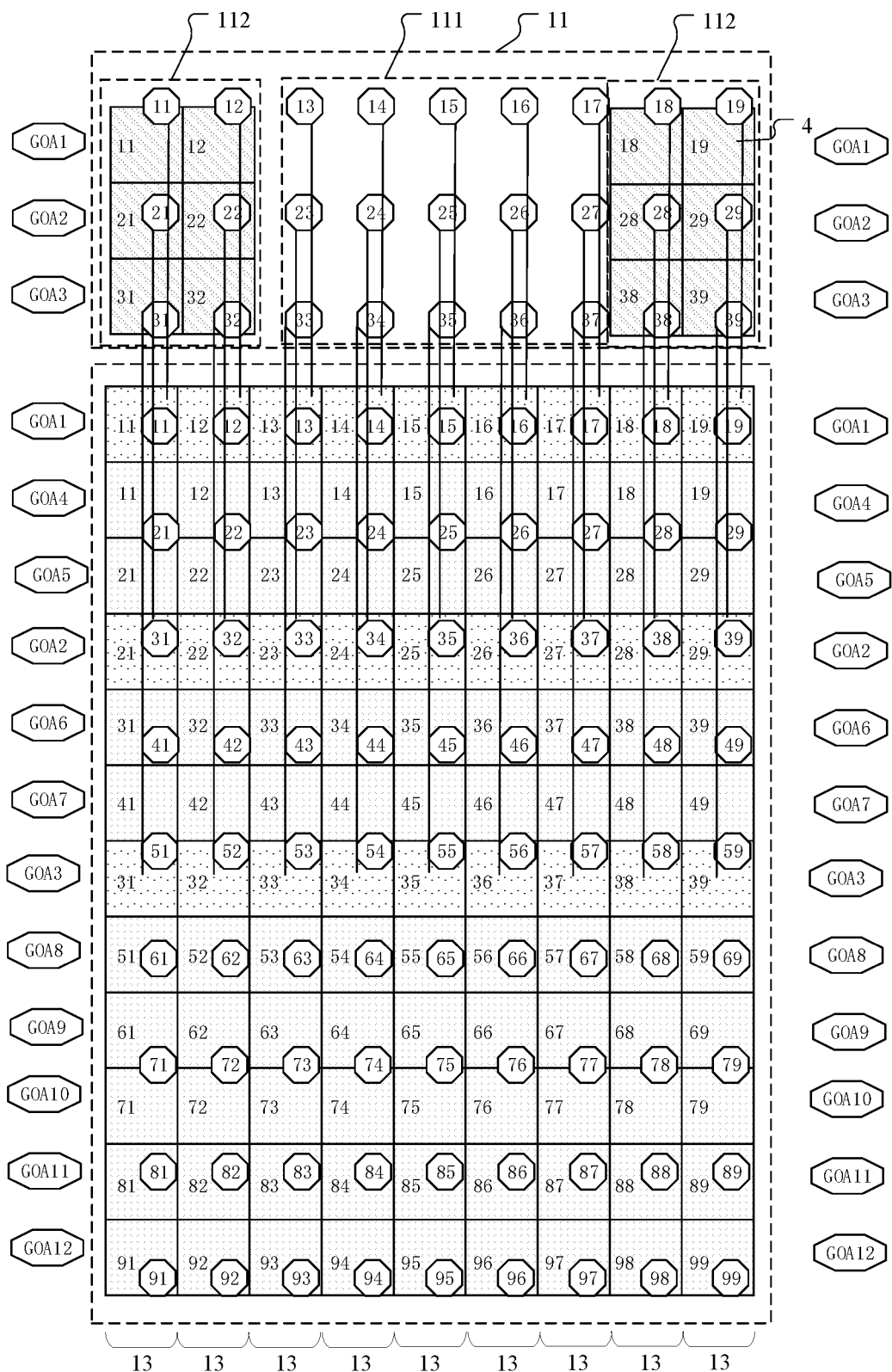
FIG. 8 is a schematic structural diagram of a display panel according to another exemplary embodiment of the present disclosure.

As shown in FIG. 8, a schematic structural diagram of a display panel according to another exemplary embodiment of the present disclosure is illustrated. The first sub-display area 112 of the display panel may also be located at both sides in the row direction of the light-transmissive area 111. As shown in FIG. 8, the display panel may further include a gate driving circuit, which may include cascaded shift register units GOA, where the numbers marked in GOA indicate the stage numbers of the respective shift register unit. For example, GOA1 represents the first stage of shift register unit. In an exemplary embodiment, the second pixel driving circuits 4 in the X-th row and the first sub-pixel driving circuits 31 in the X-th row may share the same gate driving signal. That is, the second pixel driving circuits 4 in the X-th row and the first sub-pixel driving circuits 31 in the X-th row are connected to shift register units of the same stage number. For example, as shown in FIG. 8, the second pixel driving circuits 4 in the first row and the first sub-pixel driving circuits 31 in the first row are connected to the first stage of shift register unit GOA1, and the second pixel driving circuits 4 in the second row and the first sub-pixel driving circuits 31 in the second row are connected to the second stage of shift register unit GOA2. In an exemplary embodiment, each row of pixel driving circuits can be respectively provided with two shift register units, wherein the two shift register units can be located at both sides of such row of pixel driving circuits, and the two shift register units can drive such row of pixel driving circuits simultaneously.

In an exemplary embodiment, as shown in FIGS. 5-7, similarly, the second pixel driving circuits 4 in the X-th row and the first sub-pixel driving circuits 31 in the X-th row may share the same gate driving signal, where X is a positive integer greater than or equal to 1 and less than or equal to 3.

Figure 9:
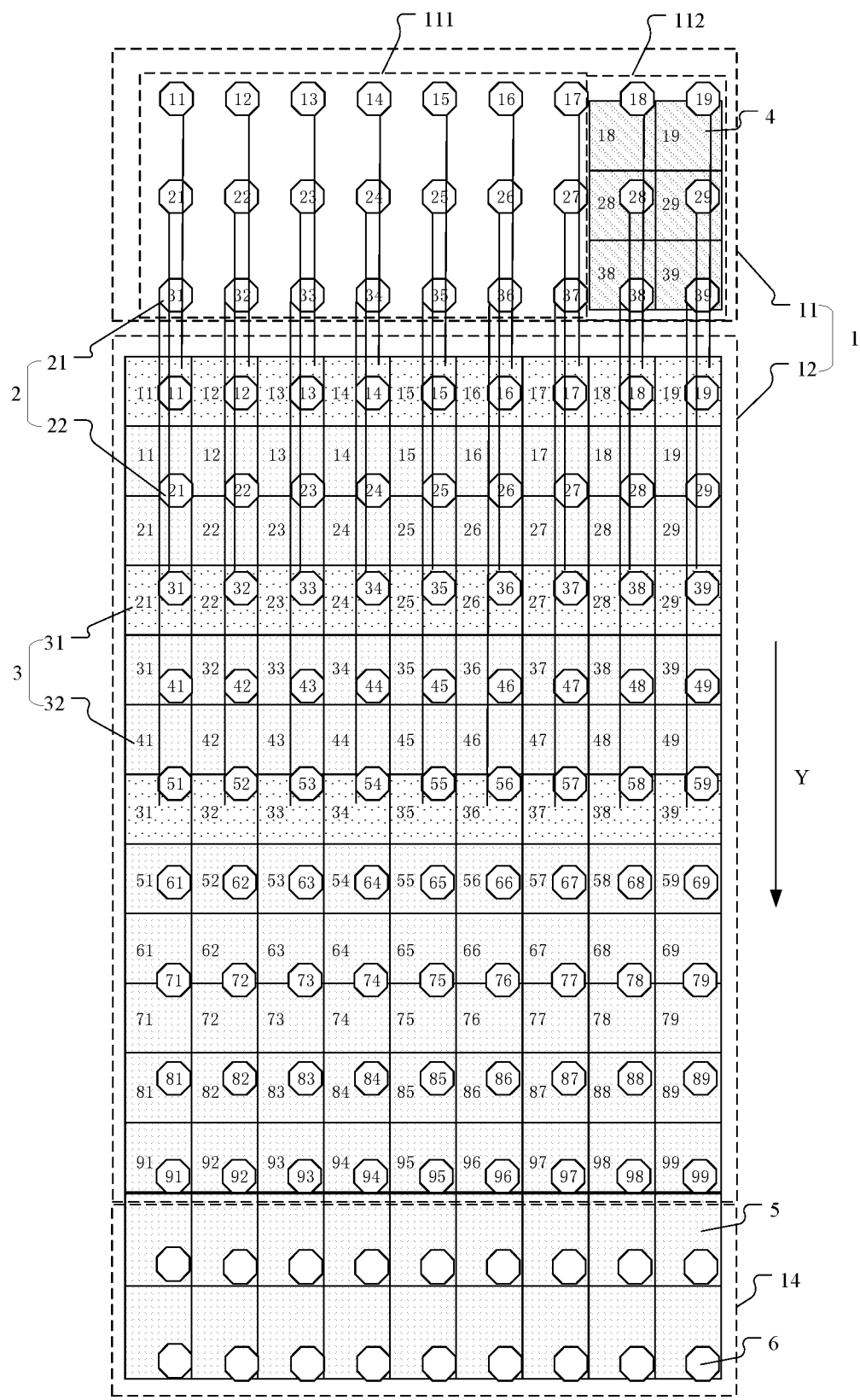
FIG. 9 is a schematic structural diagram of a display panel according to another exemplary embodiment of the present disclosure.

In an exemplary embodiment, as shown in FIG. 9, a schematic structural diagram of a display panel according to another exemplary embodiment of the present disclosure is illustrated. The display panel may further include a normal display area 14. The normal display area 14 may be located at a side of the first compression area 12 away from the first external area 11, and the display panel may also include a third pixel driving circuit 5. The third pixel driving circuit 5 may be located in the normal display area 14, and the size in the column direction of the third pixel driving circuit 5 may be larger than the size in the column direction of the first pixel driving circuit 3. That is, the display panel may compress only part rows of the pixel driving circuits in the column direction, and the pixel driving circuits in the normal display area 14 may not by compressed. The normal display area 14 may also be provided with light-emitting units 6 each corresponding to a respective third pixel driving circuit 5. The pixel density of the normal display area 14 may be equal to the pixel density of the first display area 1.

In an exemplary embodiment, the ratio of the size in the column direction of the first external area 11 to the size in the column direction of the first compression area 12 may be from 1:12 to 1:8, for example, being 1:12, 1:10, 1:9, 1:8, etc. The first pixel driving circuits 3 located in the first display area 1 are compressed in the column direction to be 1/11 of the original size. That is, it can be achieved that the ratio of the size in the column direction of the first external area 11 to the size in the column direction of the first compression area 12 is 1:10.

In an exemplary embodiment, when the number of rows in the first sub-light-emitting units 21 is M rows, M connection lines need to be provided in each of the first column-direction extension areas 13, so as to connect the first sub-light-emitting units 21 and the first sub-pixel driving circuit 31. When the number of rows in the first sub-light-emitting unit 21 is large, the first column-direction extension area 13 will not be able to accommodate the corresponding number of connection lines. Therefore, in an embodiment, limitations are put on the number of rows in the first sub-light-emitting units 21. That is, in an embodiment, limitations are put on the column size of the camera.

Figure 10:
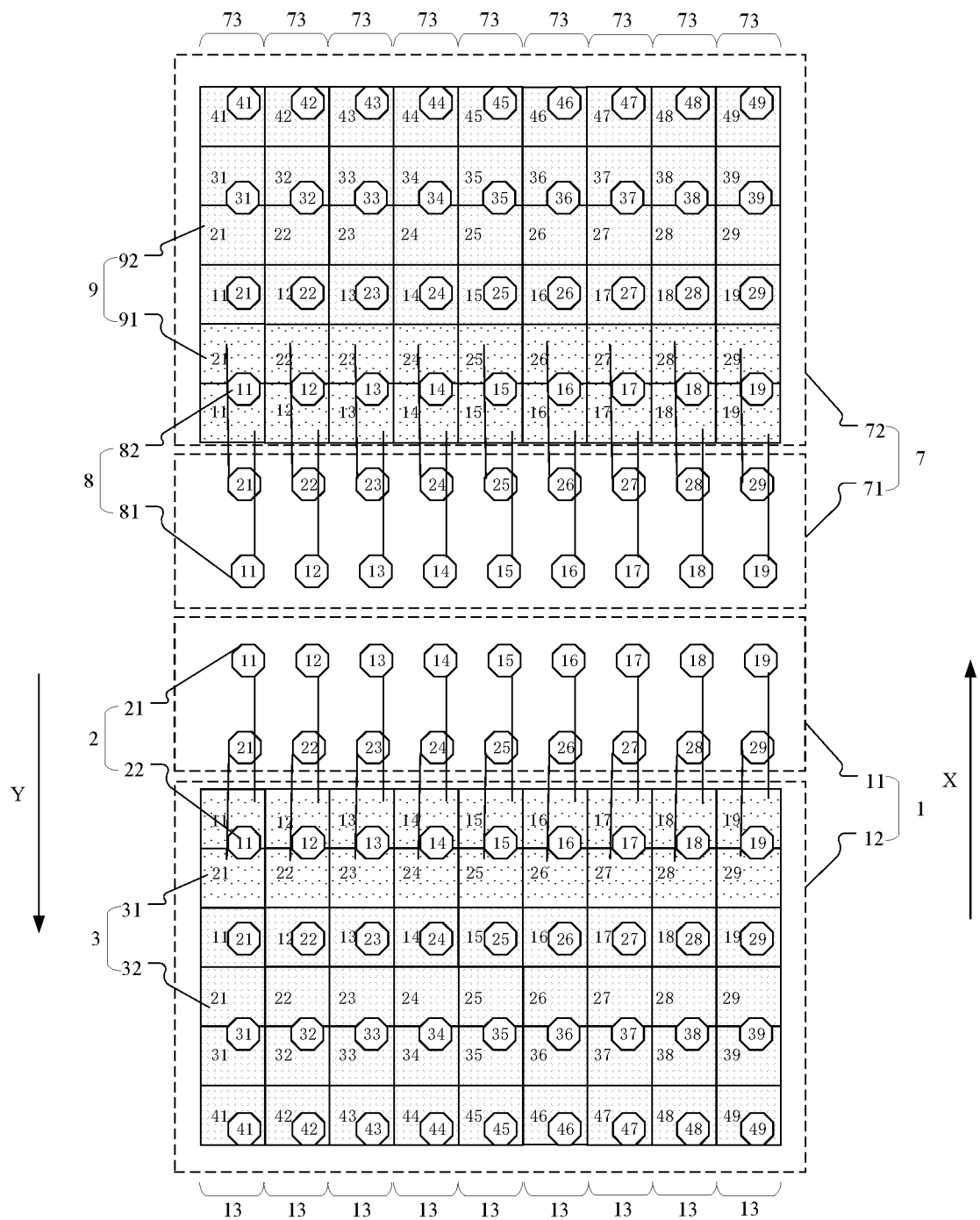
FIG. 10 is a schematic structural diagram of a display panel according to another exemplary embodiment of the present disclosure.

In an exemplary embodiment, as shown in FIG. 10, a schematic structural diagram of a display panel according to another exemplary embodiment of the present disclosure is illustrated. The display panel may further include a second display area 7. The second display area 7 may include a second external area 71 and a second compression area 72. The second external area 71 may be located at a side of the first external area 11 away from the first compression area 12. The second compression area 72 may be located at a side of the second external area 71 away from the first external area 11. The display panel may also include a plurality of fourth light-emitting units 8 and a plurality of fourth pixel driving circuits 9. The number of the fourth light-emitting units and the number of the fourth pixel driving circuits may be the same. The plurality of fourth light-emitting units 8 may be arranged in an array along the row and column directions in the second display area 7. The plurality of fourth pixel driving circuits 9 may be arranged in an array along the row and column directions in the second compression area 72. At least part of the fourth pixel driving circuits 9 can be configured to provide driving current to the fourth light-emitting units 8 located in the second external area 71. The number of rows in the fourth pixel driving circuits 9 is equal to the number of rows in the fourth light-emitting units 8, and the number of columns in the fourth pixel driving circuits 9 is equal to the number of columns in the fourth light-emitting units 8.

In an exemplary embodiment, as shown in FIG. 10, in the second display area, the number of the fourth light-emitting units in each row of the fourth light-emitting units may be equal to the number of the fourth pixel driving units in each row of the fourth pixel driving circuits. The number of the fourth light-emitting units in each column of the fourth light-emitting units may be equal to the number of the fourth pixel driving units in each column of the fourth pixel driving circuits. The density of the fourth light-emitting units in the second compression area 72 may be equal to the density of the fourth light-emitting units in the second external area.

In an exemplary embodiment, as shown in FIG. 10, the second display area 7 may include a plurality of second column-direction extension areas 73 arranged along the row direction, and each of the second column-direction extension areas 73 extends along the column direction. The numbers of columns in the second column-direction extension areas 73, the fourth light-emitting units 8, and the first light-emitting units 2 may be the same. The second column-direction extension areas 73 are arranged directly opposite to the first column-direction extension areas 13 in the column direction. Each of the second column-direction extension areas 73 may be respectively provided with a column of the fourth light-emitting units 8 and a column of the fourth pixel driving circuits 9. The second column-direction extension areas 73 and the first column-direction extension areas 13 are arranged directly opposite to each other in the column direction. This means that the area covered by the second column-direction extension areas 73 infinitely extending in the column direction coincides with the area covered by the first column-direction extension areas 13 infinitely extending in the column direction.

In an exemplary embodiment, the first pixel driving circuits 3 in the first display area 1 are compressed in the column direction into the first compression area 12, so as to reserve the first external area 11. At the same time, the fourth pixel driving circuits 9 in the second display area 7 are compressed in the column direction into the second compression area 72, so as to reserve the second external area 71. Cameras may be accordingly arranged in the first external area 11 and the second external area 71. As shown in FIG. 10, the first external area and the second external area are integrated with 4 rows of light-emitting units, but the first column-direction extension areas 13 and the second column-direction extension areas 73 only need to integrate two connection lines respectively. With the same column size of the external area, this setting can reduce the number of connection lines in the column-extension areas, so that a larger size camera can be installed accordingly.

In an exemplary embodiment, as shown in FIG. 10, the plurality of fourth light-emitting units 8 may include: third sub-light-emitting units 81 in an array of 2 rows and 9 columns, and fourth sub-light-emitting units 82 in an array of 4 rows and 9 columns. The third sub-light-emitting units 81 are located in the second external area 71. The third sub-light-emitting units 81 in the (X+1)-th row are located at a side in the second direction X of the third sub-light-emitting units 81 in the X-th row, wherein the second direction X is opposite to the first direction Y, and X is a positive integer. The fourth sub-light-emitting units 82 may be located in the second compression area 72. The fourth sub-light-emitting units 82 in the (X+1)-th row are located at a side in the second direction of the fourth sub-light-emitting units 82 in the X-th row, where X is a positive integer greater than or equal to 1 and less than or equal to 3. The fourth pixel driving circuits 9 may include the third sub-pixel driving circuits 91 in an array of 2 rows and 9 columns, and the fourth sub-pixel driving circuits 92 in an array of 4 rows and 9 columns. The third sub-light-emitting units 81 may provide driving current to the third sub-light-emitting units 81. The third sub-pixel driving circuits 91 in the (X+1)-th row are located at a side in the second direction of the third sub-pixel driving circuits 91 in the X-th row, where X is positive integer. The fourth sub-pixel driving circuits 92 are configured to provide driving current to the fourth sub-light-emitting units 82. The fourth sub-pixel driving circuits 92 in the (X+1)-th row can be located at a side in the second direction X of the fourth sub-pixel driving circuits 92 in the X-th row, where X is a positive integer greater than or equal to 1 and less than or equal to 3. As shown in FIG. 10, the numbers marked in the third sub-light-emitting units 81 represent the row and column coordinates of the respective third sub-light-emitting unit 81. For example, the number 11 represents the third sub-light-emitting unit 81 in the first row and the first column. In the same way, the numbers in the fourth sub-light-emitting units 82, the third sub-pixel driving circuits 91, and the fourth sub-pixel driving circuits 92 respectively represent the row and column coordinates thereof.

In an exemplary embodiment, as shown in FIG. 10, the third sub-pixel driving circuits 91 in the X-th row may be configured to provide driving current to the third sub-light-emitting units 81 in the X-th row located in the same second column-direction extension area 73, where X is a positive integer greater than or equal to 1 and less than or equal to 2. The fourth sub-pixel driving circuits 92 in the X-th row can be configured to provide driving current to the fourth sub-light-emitting units 82 in the X-th row located in the same second column-direction extension area 73, where X is a positive integer greater than or equal to 1 and less than or equal to 4. Besides, the fourth sub-pixel driving circuits 92 in any row may be located at a side in the second direction X of the third sub-pixel driving circuits 81 in any row.

It should be understood that in other exemplary embodiments, the third sub-light-emitting units 81, the fourth sub-light-emitting units 82, the third sub-pixel driving circuits 91, and the fourth sub-pixel driving circuits 92 in the second display area 7 may also have other number of rows and columns, which shall all fall within the protection scope of the present disclosure.

Figure 11:
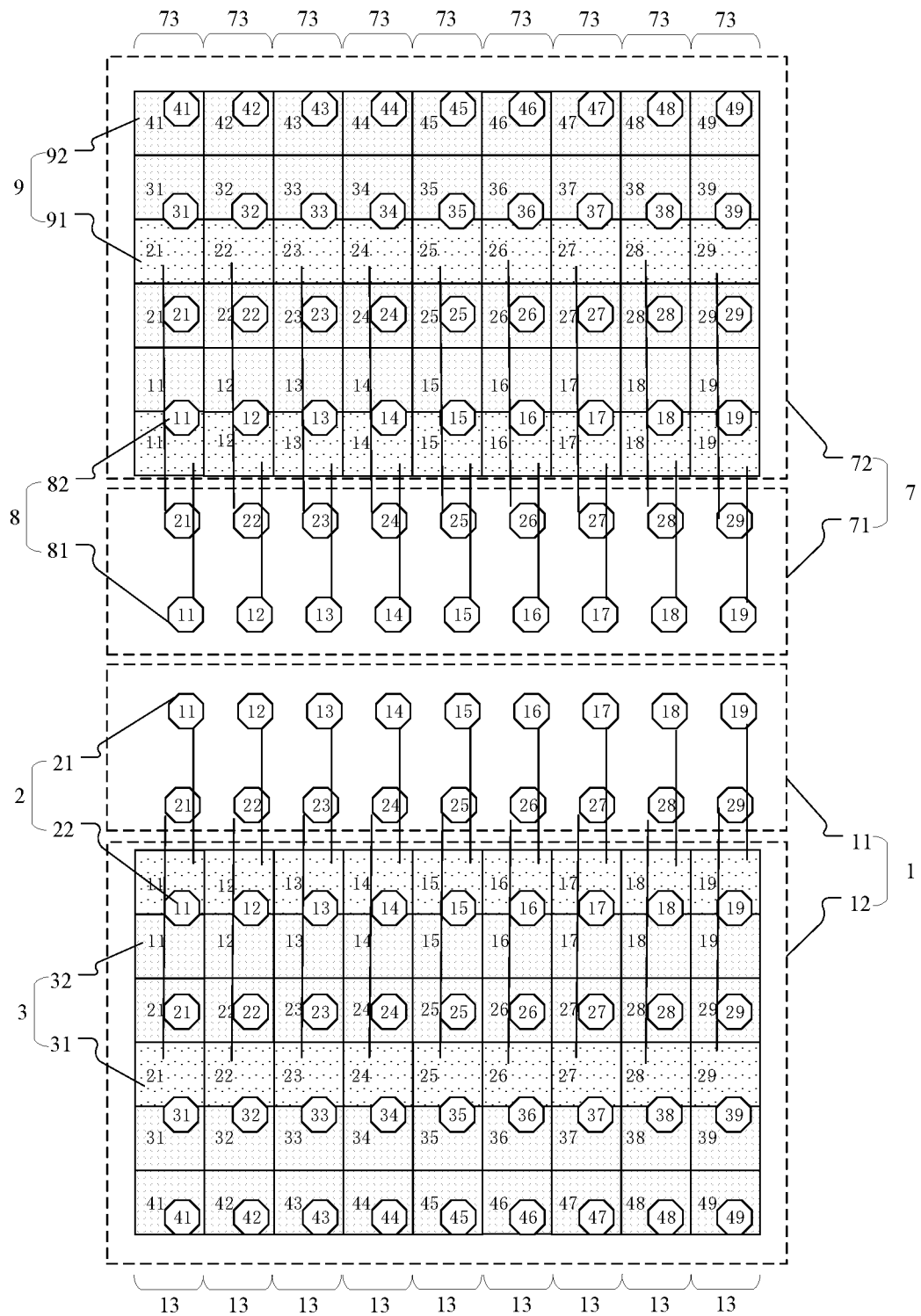
FIG. 11 is a schematic structural diagram of a display panel according to another exemplary embodiment of the present disclosure.

As shown in FIG. 11, a schematic structural diagram of a display panel according to another exemplary embodiment of the present disclosure is illustrated. In an exemplary embodiment, two rows of the fourth sub-pixel driving circuits 92 may be provided between every two adjacent rows of the third sub-pixel driving circuits 91. The third sub-pixel driving circuits 91 in the first row may be located at a side in the first direction Y of the fourth sub-pixel driving circuits 92 in the first row.

It should be understood that, in other exemplary embodiments, other number of rows of the fourth sub-pixel driving circuits 92 may also be arranged between every two adjacent rows of the third sub-pixel driving circuits 91. For example, three rows of the fourth sub-pixel driving circuits 92 may be arranged between every two adjacent rows of the third sub-pixel driving circuits 91. The number of rows of the fourth sub-pixel driving circuits 92 between every two adjacent rows of the third sub-pixel driving circuits 91 may be the same or different. In addition, the third sub-pixel driving circuits 91 in the first row can also be arranged at other positions. For example, the third sub-pixel driving circuits 91 in the first row can be arranged at a side in the second direction X of the fourth sub-pixel driving circuits 92 in the first row.

In an exemplary embodiment, the connection line between the first sub-pixel driving circuit 31 and the first sub-light-emitting unit 21, the connection line between the second sub-pixel driving circuit 32 and the second sub-light-emitting unit 22, the connection line between the third sub-pixel driving circuit 91 and the third sub-light-emitting unit 81, and the connection line between the fourth sub-pixel driving circuit 92 and the fourth sub-light-emitting unit 82 may be transparent conductive lines. For example, the material of the connection lines may be indium tin oxide. In order to increase the integration degree of the connection lines in the row direction, the connection lines may be located on different conductive layers.

Figure 12:
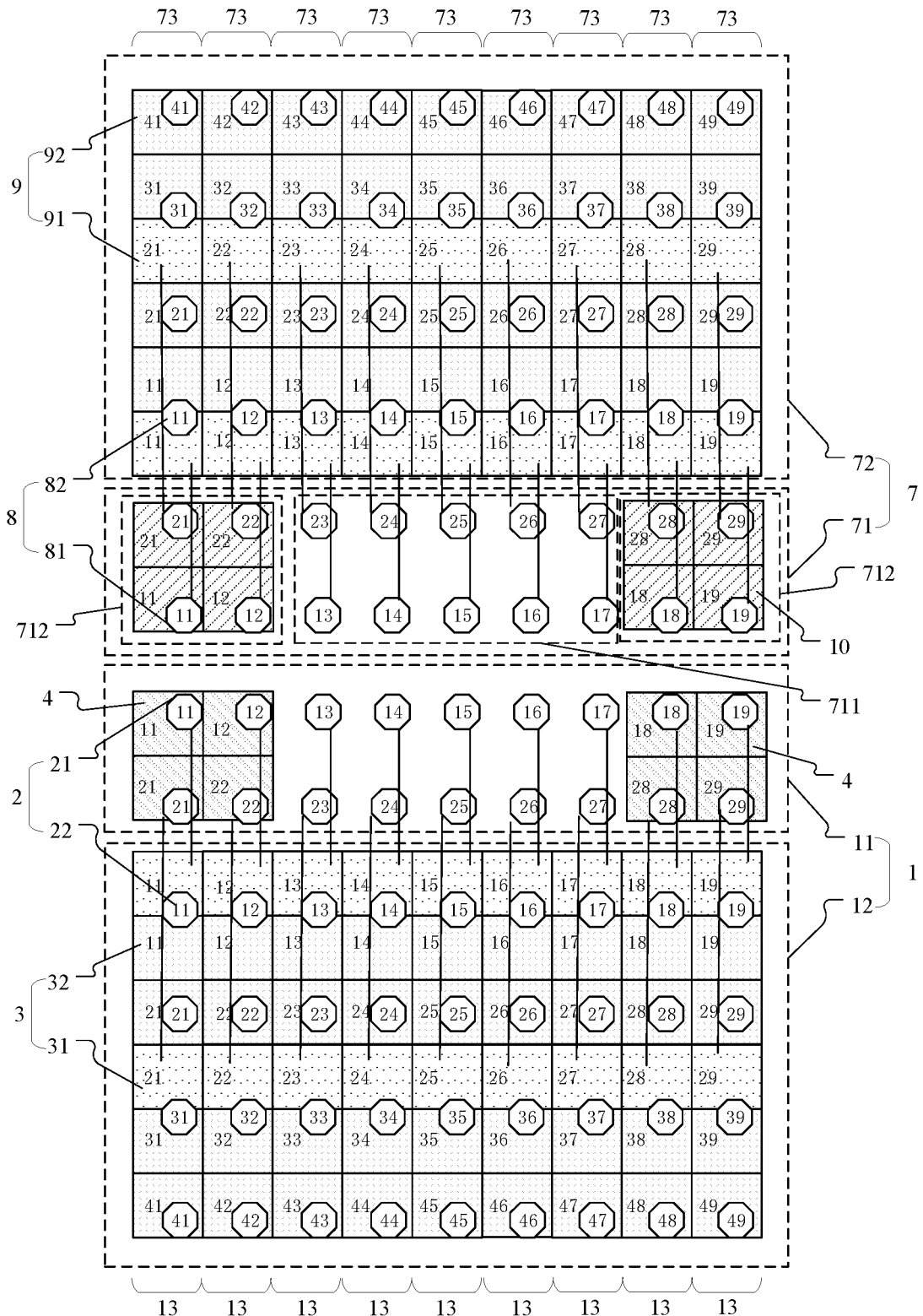
FIG. 12 is a schematic structural diagram of a display panel according to another exemplary embodiment of the present disclosure.

In an exemplary embodiment, as shown in FIG. 12, a schematic structural diagram of a display panel according to another exemplary embodiment of the present disclosure is illustrated. The second external area 71 may include a second light-transmissive area 711 and a second sub-display area 712. The second light-transmissive area 711 and the second sub-display area 712 may be arranged along the row direction. The display panel may also include a plurality of fifth pixel driving circuits 10. The fifth pixel driving circuits 10 may be located in the second sub-display area 712. The plurality of fifth pixel driving circuits 10 may include the fifth pixel driving circuit arranged along the row and column directions in an array of 2 rows and 4 columns. The fifth pixel driving circuits 10 in the (X+1)-th row are located at a side n the second direction X of the fifth pixel driving circuits 10 in the X-th row, where X is a positive integer. The number of columns in the fifth pixel driving circuits may be equal to the number of columns of the third sub-light-emitting units 81 in the second sub-display area 712. Each column of the second column-direction extension areas 73 located in the second sub-display area 712 is respectively provided with a column of the fifth pixel driving circuits 10. In the same second column-direction extension area 73, the fifth pixel driving circuits 10 in the X-th row may be configured to provide driving current to the third sub-light-emitting units 81 in the X-th row located in the second sub-display area 712, where X is a positive integer greater than or equal to 1 and less than or equal to 2. In the same second column-direction extension area 73, the third sub-pixel driving circuits 91 in the X-th row may be used to provide driving current to the third sub-light-emitting units 81 in the X-th row located in the second light-transmissive area 711, where X is a positive integer greater than or equal to 1 and less than or equal to 2. It should be understood that, in other exemplary embodiments, the fifth pixel driving circuits 10 having other number of rows and columns may also be integrated in the second sub-display area.

In an exemplary embodiment, as shown in FIG. 12, the second light-transmissive area 711 and the first light-transmissive area 111 may be arranged oppositely in the column direction. That is, the area covered by the second light-transmissive area 711 infinitely extending in the column direction coincides with the area covered by the first light-transmissive area 111 extending infinitely in the column direction.

In an exemplary embodiment, as shown in FIG. 12, the second sub-display area is located at both sides in the row direction of the light-transmissive area. It should be understood that in other exemplary embodiments, the second sub-display area is located at one side in the row direction of the light-transmissive area.

In an exemplary embodiment, as shown in FIG. 12, the fifth pixel driving circuits 10 in the X-th row and the third sub-pixel driving circuits 91 in the X-th row may share the same gate driving signal, where X is a positive integer greater than or equal to 1 and less than or equal to 2.

Figure 13:
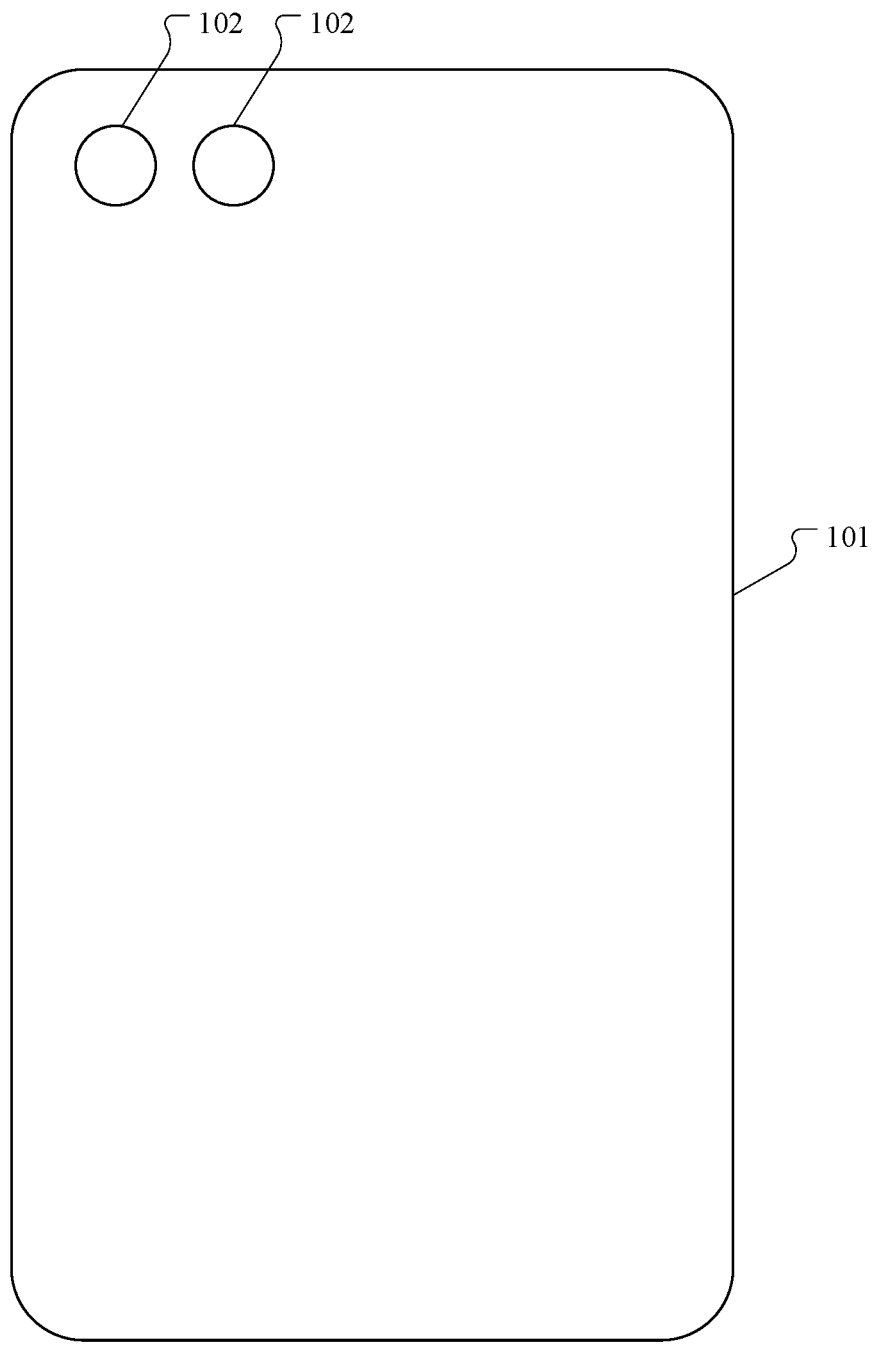
FIG. 13 is a schematic structural diagram of a display device according to the present disclosure.

An exemplary embodiment also provides a display device, as shown in FIG. 13, which is a schematic structural diagram of a display device according to the present disclosure. The display device may include the above-mentioned display panel 101 and a camera 102. The camera 102 may directly face the first light-transmissive area and the second light-transmissive area of the display panel. As shown in FIG. 13, there may be two cameras 102, and the two cameras may be arranged along the row direction. The display device may be a display device such as a mobile phone or a tablet computer.

Those skilled in the art will easily think of other embodiments of the present disclosure after considering the specification and practicing the content disclosed herein. The present application is intended to cover any variations, uses, or adaptive changes of the present disclosure. These variations, uses, or adaptive changes follow the general principle of the present disclosure and include common knowledge or conventional technical means in the technical field that are not disclosed in the present disclosure. The description and the embodiments are only regarded as exemplary, and the true scope and spirit of the present disclosure are only defined by the claims.

It should be understood that the present disclosure is not limited to the precise structure that has been described above and shown in the drawings, and various modifications and changes can be made without departing from its scope. The scope of the present disclosure is limited only by the appended claims.

The invention claimed is:

1. A display panel, comprising:
    a first display area, wherein the first display area comprises a first external area and a first compression area, the first compression area is located at a side in a first direction of the first external area, and the first direction is parallel to a data line in the display panel;
    a plurality of first light-emitting units, wherein the plurality of first light-emitting units are arranged in an array along a row direction and a column direction in the first display area, wherein the column direction is parallel to the first direction; and
    a plurality of first pixel driving circuits, wherein the number of the plurality of first pixel driving circuits is the same as the number of the first light-emitting units, the plurality of first pixel driving circuits are arranged in an array along the row direction and the column direction in the first compression area, and at least part of the first pixel driving circuits is configured to provide driving current to the first light-emitting units located in the first external area,
    wherein the number of rows in the first pixel driving circuits is the same as the number of rows in the first light-emitting units, and the number of columns in the first pixel driving circuit is the same as the number of columns in the first light-emitting units.

2. The display panel according to claim 1, wherein
    the first display area comprises a plurality of first column-direction extension areas arranged along the row direction, each of the first column-direction extension areas extends in the column direction, and the number of columns in the first column-direction extension areas is the same as the number of columns in the first light-emitting units; and
    each of the first column-direction extension areas is respectively provided with a column of the first light-emitting units and a column of the first pixel driving circuits.

3. The display panel according to claim 2, wherein
    the plurality of first light-emitting units comprise:
        first sub-light-emitting units in an array of N1 rows and M columns located in the first external area, wherein the first sub-light-emitting units in the (X+1)-th row is located at a side in the first direction of the first sub-light-emitting units in the X-th row, where X is a positive integer greater than or equal to 1 and less than or equal to N1−1; and
        second sub-light-emitting units in an array of N2 rows and M columns located in the first compression area, wherein the second sub-light-emitting units in the (X+1)-th row is located at a side in the first direction of the second sub-light-emitting units in the X-th row, where X is a positive integer greater than or equal to 1 and less than or equal to N2−1,
    the first pixel driving circuits comprise:
        first sub-pixel driving circuits in an array of N1 rows and M columns, wherein at least part of the first sub-pixel driving circuits is configured to provide driving current to the first sub-light-emitting units, and the first sub-pixel driving circuits in the (X+1)-th row are located at a side in the first direction of the first sub-pixel driving circuits in the X-th row, where X is a positive integer greater than or equal to 1 and less than or equal to N1−1; and
        second sub-pixel driving circuits in an array of N2 rows and M columns, wherein the second sub-pixel driving circuits are configured to provide driving current to the second sub-light-emitting units, and the second sub-pixel driving circuits in the (X+1)-th row are located at a side in the first direction of the second sub-pixel driving circuits in the X-th row, where X is a positive integer greater than or equal to 1 and less than or equal to N2−1,
    wherein N1 is a positive integer greater than or equal to 1, and M is a positive integer greater than or equal to 1.

4. The display panel according to claim 3, wherein
    the first sub-pixel driving circuits in the X-th row are configured to provide driving current to the first sub-light-emitting units in the X-th row located in the same first column-direction extension area, where X is a positive integer greater than or equal to 1 and less than or equal to N1; and
    the second sub-pixel driving circuits in the X-th row are configured to provide driving current to the second sub-light-emitting unit in the X-th row located in the same first column-direction extension area, where X is a positive integer greater than or equal to 1 and less than or equal to N2.

5. The display panel according to claim 3, wherein the first external area comprises a first light-transmissive area and a first sub-display area, the first light-transmissive area and the first sub-display area are arranged along the row direction, and the display panel further comprises:
    a plurality of second pixel driving circuits located in the first sub-display area, wherein the plurality of second pixel driving circuits comprise second pixel driving circuits arranged along the row direction and the column direction in an array of N1 rows and M1 columns, and the second pixel driving circuits in the (X+1)-th row is located at a side in the first direction of the second pixel driving circuits in the X-th row, where X is a positive integer greater than or equal to 1 and less than or equal to N1−1, and M1 is equal to the number of columns of the first sub-light-emitting units in the first sub-display area, wherein
    each first column-direction extension area located in the first sub-display area is respectively provided with a row of the second pixel driving circuits;
    in the same first column-direction extension area, the second pixel driving circuits in the X-th row are configured to provide driving current to the first sub-light-emitting units in the X-th row located in the first sub-display area, where X is a positive integer greater than or equal to 1 and less than or equal to N1; and
    in the same first column-direction extension area, the first sub-pixel driving circuits in the X-th row are configured to provide driving current to the first sub-light-emitting units in the X-th row located in the light-transmissive area, where X is a positive integer greater than or equal to 1 and less than or equal to N1.

6. The display panel according to claim 5, wherein the first sub-display area is located at one side or both sides in the row direction of the light-transmissive area.

7. The display panel according to claim 5, wherein the second pixel driving circuits in the X-th row and the first sub-pixel driving circuits in the X-th row share the same gate driving signal.

8. The display panel according to claim 3, wherein the second sub-pixel driving circuits in each row is located at a side in the first direction of the first sub-pixel driving circuits in each row.

9. The display panel according to claim 3, wherein a plurality of the first sub-pixel driving circuits comprise two adjacent rows of the first sub-pixel driving circuits, and at least one row of the second sub-pixel driving circuits is arranged between the two adjacent rows of the first sub-pixel driving circuits.

10. The display panel according to claim 9, wherein the same number of rows of the second sub-pixel driving circuits are arranged between every two adjacent rows of the first sub-pixel driving circuits.

11. The display panel according to claim 1, wherein:
the display panel further comprises a normal display area, the normal display area is located at a side of the first compression area away from the first external area;
the display panel further comprises a third pixel driving circuit located in the normal display area; and
a size in the column direction of the third pixel driving circuit is larger than a size in the column direction of each of the first pixel driving circuits.

12. The display panel according to claim 11, wherein a pixel density in the normal display area is equal to a pixel density in the first display area.

13. The display panel according to claim 1, wherein a ratio of a size in the column direction of the first external area to a size in the column direction of the first compression area is in a range from 1:12 to 1:8.

14. The display panel according to claim 5, wherein the display panel further comprises a second display area, the second display area comprises a second external area and a second compression area, the second external area is located at a side of the first external area away from the first compression area, the second compression area is located at a side of the second external area away from the first external area, and the display panel also comprises:
a plurality of fourth light-emitting units, wherein the plurality of fourth light-emitting units are arranged in an array along the row direction and the column direction in the second display area; and
a plurality of fourth pixel driving circuits, the number of which is the same as the number of the fourth light-emitting units, wherein the plurality of fourth pixel driving circuits are arranged in an array along the row direction and the column direction in the second compression area, and at least part of the fourth pixel driving circuits is configured to provide driving current to the fourth light-emitting units located in the second external area,
wherein the number of rows in the fourth pixel driving circuits is equal to the number of rows in the fourth light-emitting units, and the number of columns in the fourth pixel driving circuits is equal to the number of columns in the fourth light-emitting units.

15. The display panel according to claim 14, wherein the second display area comprises a plurality of second column-direction extension areas arranged along the row direction, each of the second column-direction extension areas extends along the column direction, the numbers of columns in the second column-direction extension areas, the fourth light-emitting units, and the first light-emitting units are the same, and the second column-direction extension areas are directly opposite to the first column-direction extension areas in the column direction; and
each of the second column-direction extension areas is respectively provided with a column of the fourth light-emitting units and a column of the fourth pixel driving circuits.

16. The display panel according to claim 15, wherein:
the plurality of fourth light-emitting units comprise:
third sub-light-emitting units in an array of N3 rows and M columns located in the second external area, wherein the third sub-light-emitting units in the (X+1)-th row are located at a side in a second direction of the third sub-light-emitting units in the X-th row, where the second direction is opposite to the first direction, and X is a positive integer greater than or equal to 1 and less than or equal to N3−1; and
fourth sub-light-emitting units in an array of N4 rows and M columns located in the second compression area, wherein the fourth sub-light-emitting units in the (X+1)-th row are located at a side in the second direction of the fourth sub-light-emitting units in the X-th row, where X is a positive integer greater than or equal to 1 and less than or equal to N4−1,
the fourth pixel driving circuits comprise:
third sub-pixel driving circuits in an array of N3 rows and M columns, wherein at least part of the third sub-pixel driving circuits is configured to provide driving current to the third sub-light-emitting units, and the third sub-pixel driving circuits in the (X+1)-th row are located at a side in the second direction of the third sub-pixel driving circuits in the X-th row, where X is a positive integer greater than or equal to 1 and less than or equal to N3−1; and
fourth sub-pixel driving circuits in an array of N4 rows and M columns, wherein the fourth sub-pixel driving circuits are configured to provide driving current to the fourth sub-light-emitting units, and the fourth sub-pixel driving circuits in the (X+1)-th row are located at a side in the second direction of the fourth sub-pixel driving circuits in the X-th row, where X is a positive integer greater than or equal to 1 and less than or equal to N4−1,
wherein N3 is a positive integer greater than or equal to 1.

17. The display panel according to claim 16, wherein the third sub-pixel driving circuits in the X-th row are configured to provide driving current to the third sub-light-emitting units in the X-th row located in the same second column-direction extension area, where X is a positive integer greater than or equal to 1 and less than or equal to N3; and
the fourth sub-pixel driving circuits in the X-th row are configured to provide driving current to the fourth sub-light-emitting units in the X-th row located in the same second column-direction extension area, where X is a positive integer greater than or equal to 1 and less than or equal to N4.

18. The display panel according to claim 16, wherein the second external area comprises a second light-transmissive area and a second sub-display area, the second light-transmissive area and the second sub-display area are arranged along the row direction, and the display panel further comprises:
a plurality of fifth pixel driving circuits located in the second sub-display area, wherein the plurality of fifth pixel driving circuits comprise the fifth pixel driving circuits in an array of N3 rows and M2 columns arranged along the row direction and the column direction, and the fifth pixel driving circuits in the (X+1)-th row are located at a side in the second direction of the fifth pixel driving circuits in the X-th row, where X is a positive integer greater than or equal to 1 and less than or equal to N3−1, and M2 is equal to the number of columns of the third sub-light-emitting units in the second sub-display area, wherein each column of the second column-direction extension areas located in the second sub-display area is respectively provided with a column of the fifth pixel driving circuits;

in the same second column-direction extension area, the fifth pixel driving circuits in the X-th row are configured to provide driving current to the third sub-light-emitting units in the X-th row located in the second sub-display area, where X is a positive integer greater than or equal to 1 and less than or equal to N3; and in the same second column-direction extension area, the third sub-pixel driving circuits in the X-th row are configured to provide driving current to the third sub-light-emitting units in the X-th row located in the second light-transmissive area, where X is a positive integer greater than or equal to 1 and less than or equal to N3.

19. The display panel according to claim 18, wherein the fifth pixel driving circuits in the X-th row and the third sub-pixel driving circuits in the X-th row share the same gate driving signal, where X is a positive integer greater than or equal to 1 and less than or equal to N3.

20. A display device, comprising:

a display panel, comprising:

a first display area, wherein the first display area comprises a first external area and a first compression area, the first compression area is located at a side in a first direction of the first external area, and the first direction is parallel to a data line in the display panel;

a plurality of first light-emitting units, wherein the plurality of first light-emitting units are arranged in an array along a row direction and a column direction in the first display area, wherein the column direction is parallel to the first direction; and a plurality of first pixel driving circuits, wherein the number of the plurality of first pixel driving circuits is the same as the number of the first light-emitting units, the plurality of first pixel driving circuits are arranged in an array along the row direction and the column direction in the first compression area, and at least part of the first pixel driving circuits is configured to provide driving current to the first light-emitting units located in the first external area, wherein the number of rows in the first pixel driving circuits is the same as the number of rows in the first light-emitting units, and the number of columns in the first pixel driving circuit is the same as the number of columns in the first light-emitting units; and a camera, wherein at least part of the camera is directly opposite to the first external area of the display panel.

* * * * *